United States Patent [19]

Mori et al.

[11] Patent Number: 5,452,230
[45] Date of Patent: Sep. 19, 1995

[54] LOGIC CIRCUIT SYNTHESIZER

[75] Inventors: Hiroyuki Mori; Yoshio Inoue, both of Itami, Japan

[73] Assignee: Mitsubishi Denki Kabushiki Kaisha, Tokyo, Japan

[21] Appl. No.: 53,007

[22] Filed: Apr. 27, 1993

[30] Foreign Application Priority Data

May 7, 1992 [JP] Japan .................. 4-114702

[51] Int. Cl.⁶ ............................................. G06F 17/50
[52] U.S. Cl. .................................. 364/489; 364/488
[58] Field of Search .................. 364/488, 489, 490

[56] References Cited

U.S. PATENT DOCUMENTS

| | | | |
|---|---|---|---|
| 4,703,435 | 10/1987 | Darringer et al. | 364/489 |
| 5,029,102 | 7/1991 | Drumm et al. | 364/489 |
| 5,175,696 | 12/1992 | Hooper et al. | 364/489 |
| 5,212,650 | 5/1993 | Hooper et al. | 364/489 |
| 5,276,855 | 1/1994 | Kitahara | 364/489 |
| 5,331,569 | 7/1994 | Iijma | 364/489 |

OTHER PUBLICATIONS

"Design Systems for VLSI Logic Synthesis and Silicon Compilation" edited by G. DeMicheli et al., Martinus Nijhoff publishers.
"Hierarchical Logic Synthesis System for VLSI" by I. Matsumoto et al., IEEE preceeding of ISCAS 1985, pp. 651–654.
"Experiments in Logic Synthesis" by J. A. Darringer et al., IEEE ICCC 1980, pp. 234–237A.

*Primary Examiner*—Vincent N. Trans
*Attorney, Agent, or Firm*—Oblon, Spivak, McClelland, Maier, & Neustadt

[57] ABSTRACT

A logic circuit synthesizer is disclosed which synthesizes a better dimensioned logic circuit which has improved electrical characteristics. A logic circuit leveling part levels logic circuit data while referring to a leveling dictionary and maintaining logic function frames to thereby output leveled logic circuit data which contains information about logic function frames. The leveled logic circuit data are then given to a logic circuit synthesizing part where they are leveled using a conversion library and considering the information about logic function frames, whereby synthesized logic circuit data are produced. Since the synthesizing is performed in light of the information about logic function frames and what are prescribed in the conversion library a resultant synthesized logic circuit is improved in terms of both electrical characteristics and a dimension accuracy.

10 Claims, 17 Drawing Sheets

FIG. 7

```
<IDENTICAL FUNCTIONS>
FF1 ← FFA,
        FFC;
INV1 ← INVA;
    ⋮

<ANALGOUS FUNCTIONS>
FFN ← FF1 *n;
NAND ← NAND2 *2;
    ⋮

<FORBIDDEN FUNCTIONS>
FF2 ← FFB;
COUNT1 ← FFA+FFB
    ⋮
```

```
    FGA ← (AND1 + AND1) + {NOR1}
    FF1 ← <NAND1 + NAND1>
CIRCUITS ← (FGA1 + INV1) + {FF1}
```

LOGIC CIRCUIT SYNTHESIZER

BACKGROUND OF THE INVENTION

1. Field of the Invention

The present invention is directed to a logic circuit synthesizer for synthesizing a logic circuit which is excellent in both electrical characteristics and a dimensional accuracy.

2. Description of the Prior Art

A conventional logic circuit synthesizer levels and thereafter synthesizes an established logic circuit into a new logic circuit with further optimized features without changing the logics of the logic circuit.

FIG. 1 is a circuitry diagram of an object logic circuit which is to be synthesized into an optimized new logic circuit by a conventional logic circuit synthesizer. In FIG. 1, a composite gate 51 and a flip-flop 52, which are logic function blocks, form a logic function block 55, and a parallel arrangement of the logic function blocks 55 form a larger logic function block 50. Indicated at reference character RST is a reset signal and indicated at reference character CKT is a clock signal.

As herein termed, "logic primitive" refers to a simple element such as an AND gate and an OR gate while "logic function block" refers to an advanced logic block which is comprised of logic primitives as combined each other and which therefore features an advanced logic function. If logic function blocks are combined together, an even more advanced logic function block is realized.

Assume that the logic circuit of FIG. 1 is inputted to the conventional logic circuit synthesizer. The logic of each one of partitioned logic function blocks is expressed as a conjunctive canonical form according to the Boolean expression. For example, the logic function block 55 of FIG. 1 is divided into two logic function blocks, i.e., the composite gate 51 and the flip-flop 52, and the composite gate 51 and the flip-flop 52 are each expressed as conjunctive canonical form.

The conjunctive canonical forms are expanded so that the logic circuit as a whole is expressed as a conjunctive canonical form. Following this, according to the distributive law, parenthesis grouping a plurality of logics are removed to thereby express the functions of the LSI as a principal conjunctive canonical form. The principal conjunctive canonical form is simplified by known logical mathematical process, thus completing leveling of the logic circuit. In general, the leveling is continued until the logics of the logic circuit are simplified to logical primitive level.

Upon the leveling, the logical formulas are translated in light of technical rules and restraints which are prescribed in a technology library, concurrently with which terms of the logical formulas are combined in the same manner in which an ordinary formula is factorized, so that restraint-considered logical formulas are newly synthesized.

Thus, the conventional logic circuit synthesizer constituted as above levels and thereafter synthesizes a logic circuit which is received therein.

The leveling in the conventional logic circuit synthesizer does not consider the constitution of each logic function block. For instance, as a result of the leveling by the logic circuit of FIG. 1, the composite gate 51 and the flip-flop 52, which are to be enclosed in the logic function block 55, are expanded as completely irrelevant logic function blocks as shown in FIG. 2.

Hence, there is no guarantee that the composite gate 51 and the flip-flop 52 are synthesized into the logic function block 55 again. Rather, there is a strong possibility of failed synthesizing. In a likely event that the original logic function block 55 is not restored, a synthesized logic circuit is inferior to the original logic circuit in terms of electrical characteristics and a dimensional accuracy (e.g., lingered delay times, an increased space occupied by the circuit and longer wire lengths).

SUMMARY OF THE INVENTION

A logic circuit synthesizer of an aspect of the present invention comprises: logic circuit providing means which provides logic circuit data about an object logic circuit which is comprised of logic primitives and logic function blocks, the logic function blocks each consisting of logic primitives as combined; logic circuit leveling means which receives and levels the logic circuit data to thereby output leveled logic circuit data, the leveling of the logic circuit data involving expanding and simplifying the logic function blocks of the object logic circuit into smaller logic function blocks or logic primitives while recognizing the logic function blocks of the object logic circuit as logic function frames, the leveled logic circuit data containing information about the logic function frames; a conversion library for registering post-conversion logic primitives and logic function blocks which are identical in logic function but superior in electrical characteristics or dimensional accuracies to ante-conversion logic primitives or logic function blocks, the post-conversion logic primitives and logic function blocks being registered as conversion logic information in correspondence to the ante-conversion logic primitives and logic function blocks; and logic circuit synthesizing means which receives and synthesizes the leveled logic circuit data to thereby output synthesized logic circuit data, the synthesizing of the leveled logic circuit data involving synthesizing logic primitives or logic function blocks on the basis of the conversion logic information in light of the logic function frames.

Preferably, the logic circuit leveling means includes a leveling dictionary prescribing logic primitives and/or logic function blocks to be leveled, the leveling dictionary being referred to during the leveling of the logic circuit data.

Preferably, the conversion logic information stored in the conversion library include information in which there are provided post-conversion logic primitives or logic function blocks which are analogous in logic function but superior in electrical characteristics or dimensional characteristics to the ante-conversion logic primitives or logic function blocks in correspondence to the ante-conversion logic primitives and logic function blocks.

Further, the conversion logic information stored in the conversion library include information in which there are provided post-conversion logic primitives or logic function blocks which are to replace the ante-conversion logic primitives or logic function blocks whose use is forbidden in correspondence thereto.

Further, the dimensional characteristics include a space required, signal wire lengths and the number of signal wires of logic primitives and/or logic function blocks.

Further, the electrical characteristics include a drive capability and a delay time of logic primitives and/or logic function blocks.

As hereinabove described, the logic circuit synthesizing means synthesizes logic primitives or logic function blocks on the basis of the information in light of the logic function frames, thereby the synthesized logic circuit data being produced.

Thus, if synthesized on the basis of the conversion logic information, the logic primitives or logic function blocks of the leveled logic circuit are converted into better dimensioned logic primitives or logic function blocks which have improved electrical characteristics. A result of this is a better dimensioned logic circuit featuring improved electrical characteristics.

In addition, since the synthesizing is performed while considering the logic function frames, it is possible to synthesize ante-conversion logic function blocks into post-conversion logic function blocks as originally organized before the leveling regardless of what are contained in the conversion library. In other words, even in the worst case, the synthesizing will never produce a logic circuit which is inferior in electrical characteristics and a dimensional accuracy to an original logic circuit.

A logic circuit synthesizer of another aspect of the present invention comprises: leveled logic circuit providing means which provides leveled logic circuit data defining a leveled logic circuit; a synthesize library for registering post-synthesis logic function blocks which are identical in logic function but superior in electrical characteristics or dimensional accuracies to combination of at least one of ante-synthesis logic primitives and logic function block each consisting of combination of logic primitives, in correspondence thereto, the post-synthesis logic function block being registered as synthesizing logic information; and logic circuit synthesizing means which receives the leveled logic circuit data and synthesizes combination of logic primitives or logic function blocks in the leveled logic circuit into a logic function block in sequence, on tile basis of the synthesizing logic information, to thereby output synthesized logic circuit data.

The logic circuit synthesizer may further comprise: logic circuit providing means which provides logic circuit data about an object logic circuit which is comprised of logic primitives and logic function blocks, the logic function blocks each consisting of logic primitives as combined; and logic circuit leveling means which receives and levels the logic circuit data to thereby output leveled logic circuit data, the leveling of the logic circuit data involving expanding and simplifying the logic function blocks of the object logic circuit into smaller logic function blocks and/or logic primitives while recognizing the logic function blocks of the object logic circuit as logic function frames, the leveled logic circuit data containing information about the logic function frames.

Preferably, the logic circuit synthesizing means is further equipped with a function to output the synthesized logic circuit data in light of the information about the logic function frames.

Preferably, the synthesizing logic information include information about the ante-synthesis logic primitives and/or the ante-synthesis logic function blocks which define at least input/output connections of the ante-synthesis logic primitives and/or the ante-synthesis logic function blocks.

As described above, the logic circuit synthesizing means synthesizes the logic primitives or the logic function blocks of the leveled logic circuit on the basis of the synthesizing logic information so that the synthesized logic circuit data are produced.

Since the logic primitives or the logic function blocks of the leveled logic circuit as combined are thus synthesized into better dimensioned logic function blocks of enhanced electrical characteristics, a synthesized logic circuit has improved electrical characteristics and a dimensional accuracy.

Accordingly, it is an object of the present invention to offer a logic circuit synthesizer for synthesizing a logic circuit which has excellent electrical characteristics and a dimensional accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is an explanatory diagram showing an example of a conversion library of the first preferred embodiment of the present invention;

FIG. 12 is an explanatory diagram showing an example of synthesize grammars of the second preferred embodiment of the present invention;

FIG. 14 is an explanatory diagram showing another example of the synthesize grammars of the second preferred embodiment of the present invention;

DESCRIPTION OF THE PREFERRED EMBODIMENTS

Figure 1:
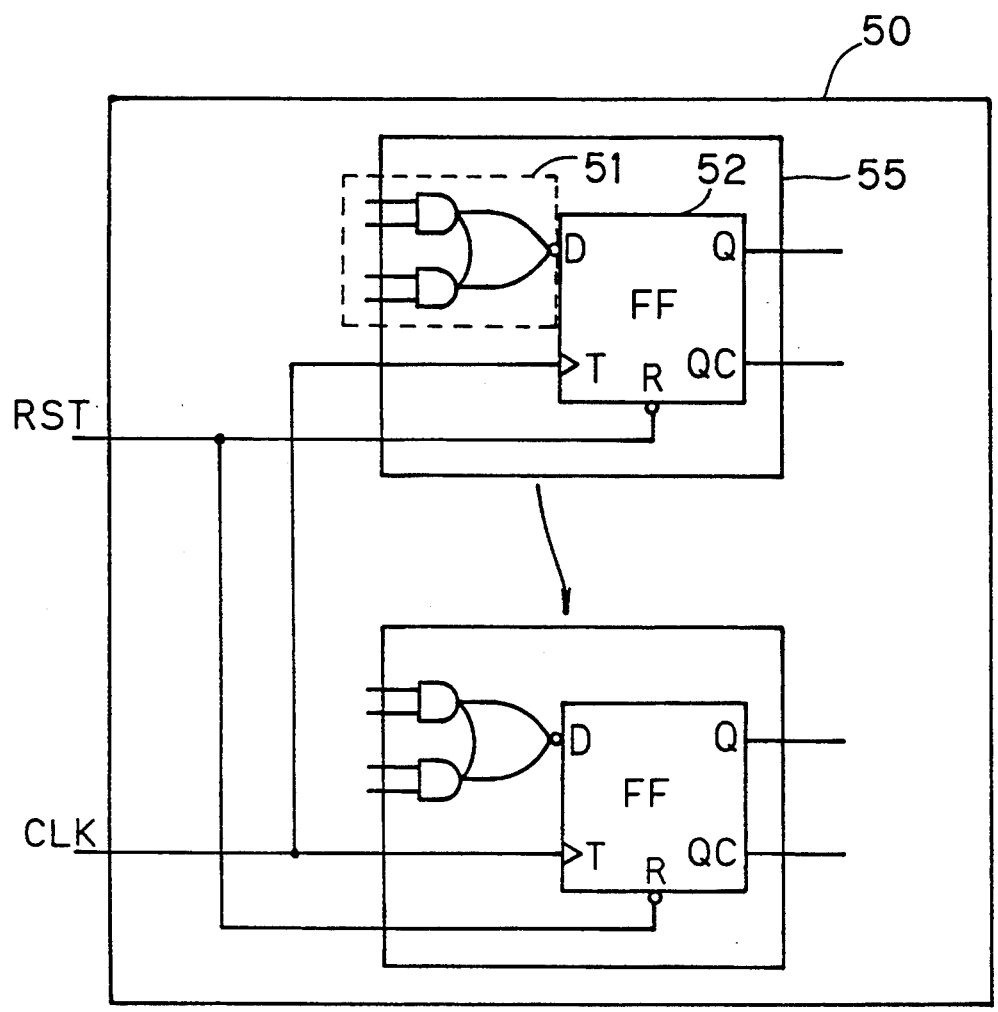
FIGS. 1 and 2 are circuitry diagrams for explaining how a conventional logic circuit synthesizer performs synthesizing.
Figure 2:
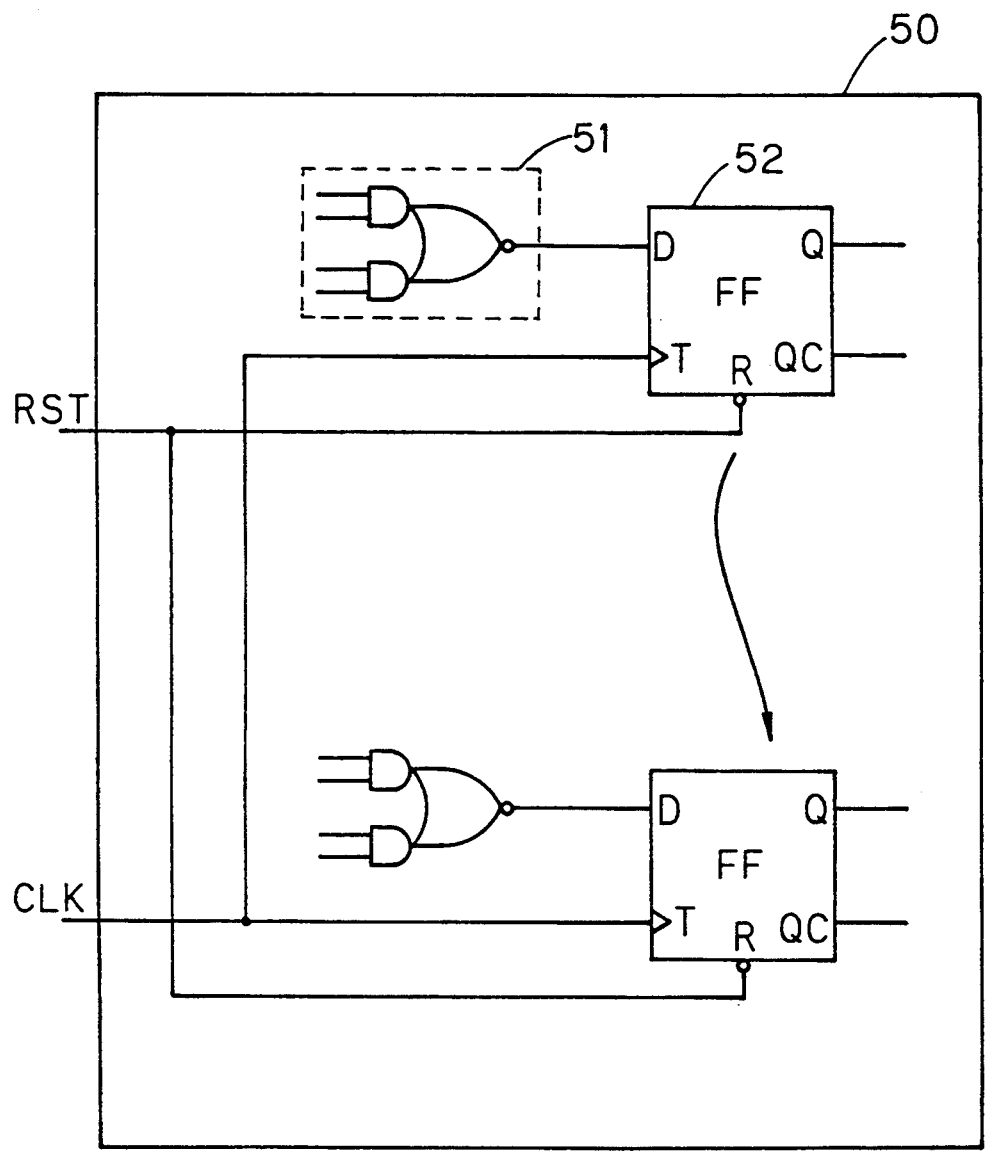
Figure 3:
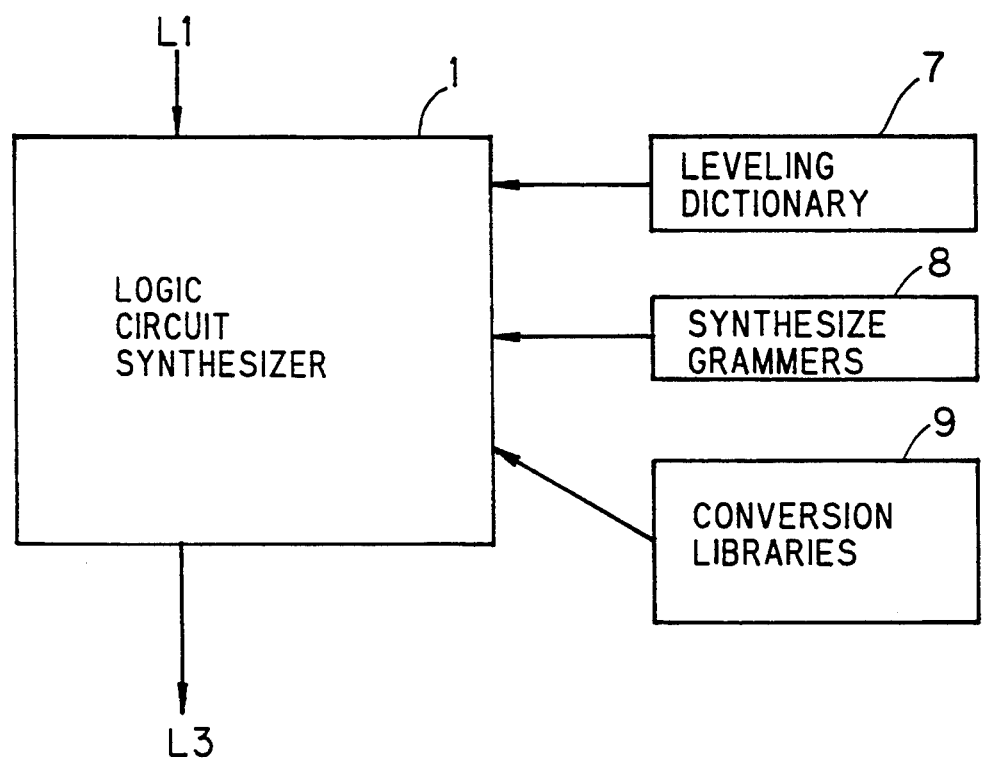
FIG. 3 is a block diagram showing the structure of a logic circuit synthesizer used in the present invention.

FIG. 3 is a block diagram showing the structure of a logic circuit synthesizer used in the present invention. As shown in FIG. 3, a logic circuit synthesizer 1 receives logic circuit data L1 which define an object logic circuit. The logic circuit synthesizer 1 then levels the object logic circuit while referring to a leveling dictionary 7, in which process concepts about frames of logic functions are maintained. Synthesizing is carried out on the basis of either one of synthesize grammars 8 and conversion libraries 9. A synthesized logic circuit is outputted from the logic circuit synthesizer.

Figure 4:
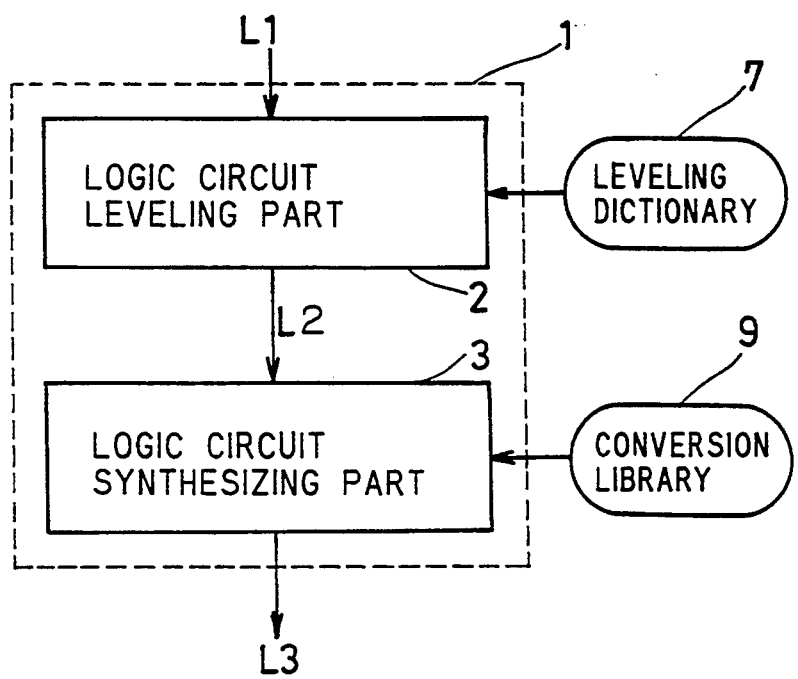
FIG. 4 is a block diagram showing the structure of a logic circuit synthesizer according to a first preferred embodiment of the present invention.

FIG. 4 is a block diagram showing the structure of a logic circuit synthesizer according to a first preferred embodiment of the present invention. A logic circuit leveling part 2 receives from logic circuit providing means (not shown) logic circuit data L1 which define an object logic circuit. The logic circuit leveling part 2 then levels the logic circuit data L1 while referring to the leveling dictionary 7 while maintaining the logic function frames, and outputs leveled logic circuit data L2 to a logic circuit synthesizing part 3. The leveled logic circuit data L2 include information about the logic function frames which are defined in the logic data L1.

In the logic circuit synthesizing part 3, the leveled logic data L2 undergo synthesizing which is executed on the basis of a conversion library 9 in light of the logic function frames. As a result of the synthesizing, synthesized logic data L3 are produced.

Figure 5:
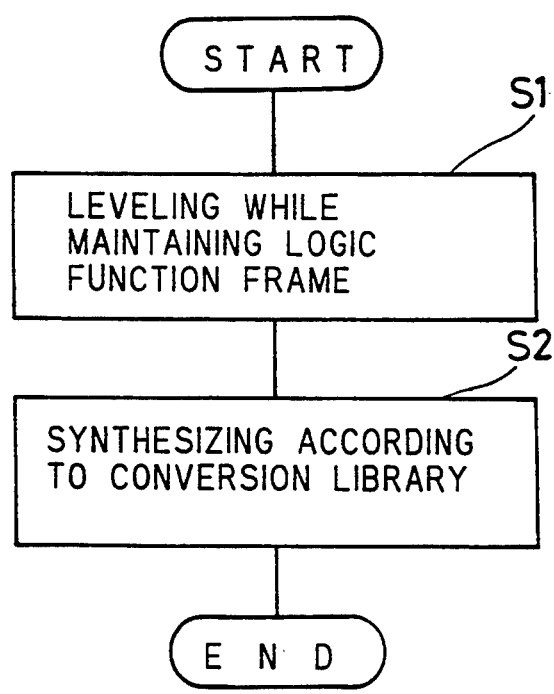
FIG. 5 is a flow chart showing operations of the logic circuit synthesizer of FIG. 4.

FIG. 5 is a flow chart showing operations of the logic circuit synthesizer of the first preferred embodiment. As shown in FIG. 5, the logic circuit leveling part 2 levels the logic circuit data L1 about an object circuit while referring to the leveling dictionary 7 and maintaining logic function frames (step S1).

Figure 6:
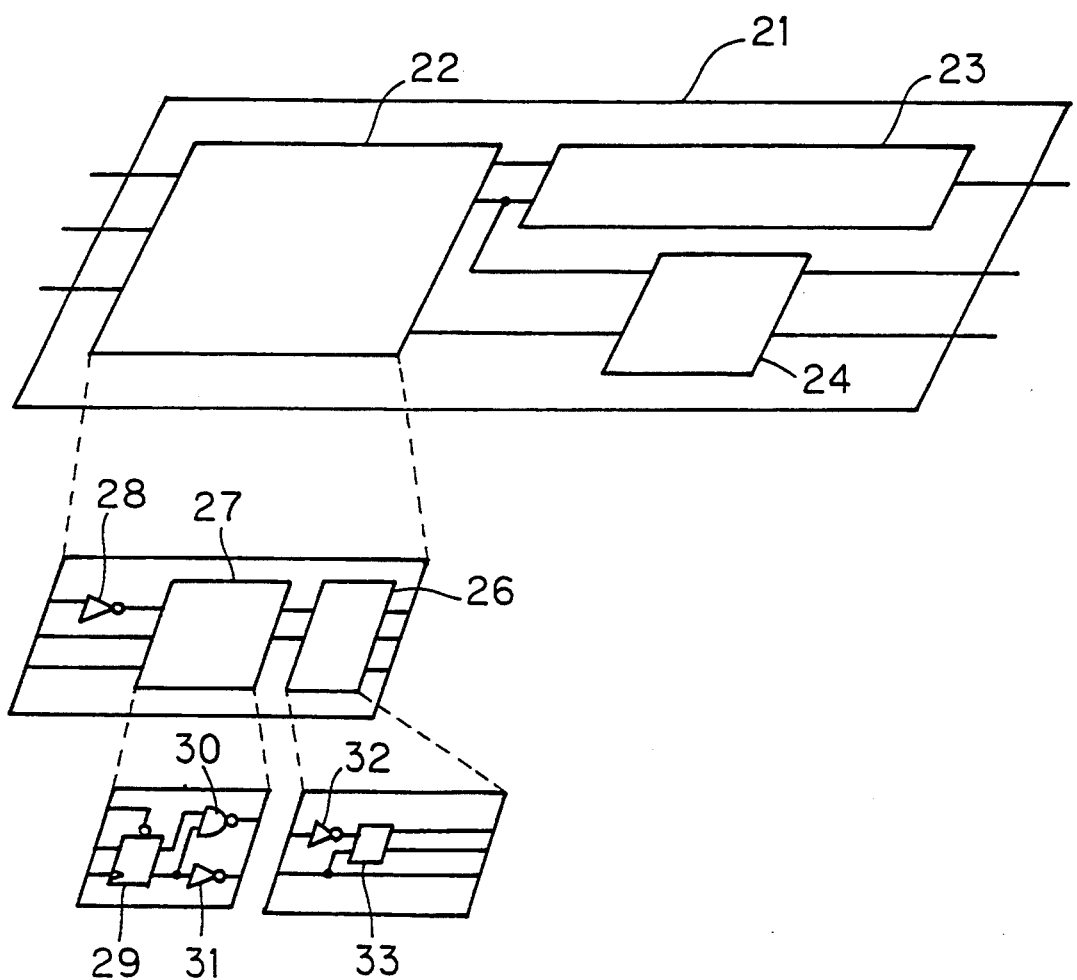
FIG. 6 is an explanatory diagram for explaining operations of a logic circuit leveling part of the first preferred embodiment and a second preferred embodiment of the present invention.

Now, the leveling will be described in detail. FIG. 6 is an explanatory diagram for explaining how the leveling is achieved. In FIG. 6, a first hierarchy logic function block, i.e., a top hierarchy logic function block is indicated at reference numeral 21. Indicated at 22 to 24 are second hierarchy logic function blocks which depend from the logic function block 21. Indicated at 26 and 27 are third hierarchy logic function blocks which depend from the logic function block 22. Indicated at 28 is a third hierarchy primitive gate (logic primitive) which depends from the logic function block 22. Indicated at 29 to 31 are fourth hierarchy primitive gates which depend from the logic function block 27, indicated at 32 and 33 are primitive gates depending from the logic function block 26.

The leveling dictionary 7 registers level logic units which are to be leveled (that is; logic function blocks and logic primitives). The logic circuit leveling part 2 expands the logic circuit data L1 into these level logic units which are registered in the leveling dictionary 7 as further as possible while consulting the leveling dictionary 7. In the example illustrated in FIG. 6, the logic function block 22 is expanded, or leveled, to as lower as the primitive gates 28 to 33. At this stage, it is important to note that the data are expanded while maintaining the information as below about the logic function frames:

a) The logic function block 21 consists of the logic function blocks 22 to 24;

b) The logic function block 22 consists of the logic function blocks 26 and 27 and the primitive gate 28;

c) The logic function block 27 consists of the primitive gates 29 to 31; and d) The logic function block 26 consists of the primitive gates 32 and 33.

The data are then processed by known logical mathematical process as in the conventional logic circuit synthesizer, following which the leveled logic circuit data L3 are outputted to the logic circuit synthesizing part 3.

If a logic function block is equipped with optimal electrical characteristics and best dimensioned, the logic function block needs not to be leveled. Hence, the leveling dictionary 7 does not register a level logic unit to which this logic function block is leveled.

Step S1 is immediately followed by step S2 wherein the logic circuit synthesizing part 3 synthesizes the leveled logic data L2 on the basis of the conversion library 9 and in light of the logic function frames which are added to the leveled logic data L2. The logic circuit synthesizing part 3 then outputs the synthesized logic data L3.

FIG. 7 is an explanatory diagram showing an example of the organization of the conversion library 9. As shown in FIG. 7, the conversion library 9 contains the following instructions about identical functions, analogous functions and forbidden functions.

a) Identical Function

Instructions which show how logic function blocks or logic primitives correspond to each other which have identical functions but different electrical characteristics such as a drive capability and a delay time.

Ex. FFI←FFA

If the instruction above is registered in the conversion library 9, a flip-flop FFA must be converted to a flip-flop FF1 since the flip-flop FF1 is identical in logic function but superior in electrical characteristics to the flip-flop FFA.

b) Analogous Function

Instructions which show how logic function blocks or logic primitives correspond to each other which have similar functions but a different number of inputs and outputs.

Ex. FFN←FF1*n

If the instruction above is registered in the conversion library 9, n flip-flops FF1 must be converted into a flip-flop FFN since the n flip-flops FFN are equivalent in logic and superior in dimensional accuracy (e.g., space it occupies) to n-byte flip-flop FF1.

c) Forbidden Function

Instructions to show use of which logic function blocks or logic primitives is forbidden and which function blocks or logic primitives are to replace the forbidden function blocks or logic primitives.

Ex. FF2←FFB

If the instruction above is registered in the conversion library 9, a flip-flop FFB must be converted into a flip-flop FF2 since use of the flip-flop FFB is forbidden.

Figure 8:
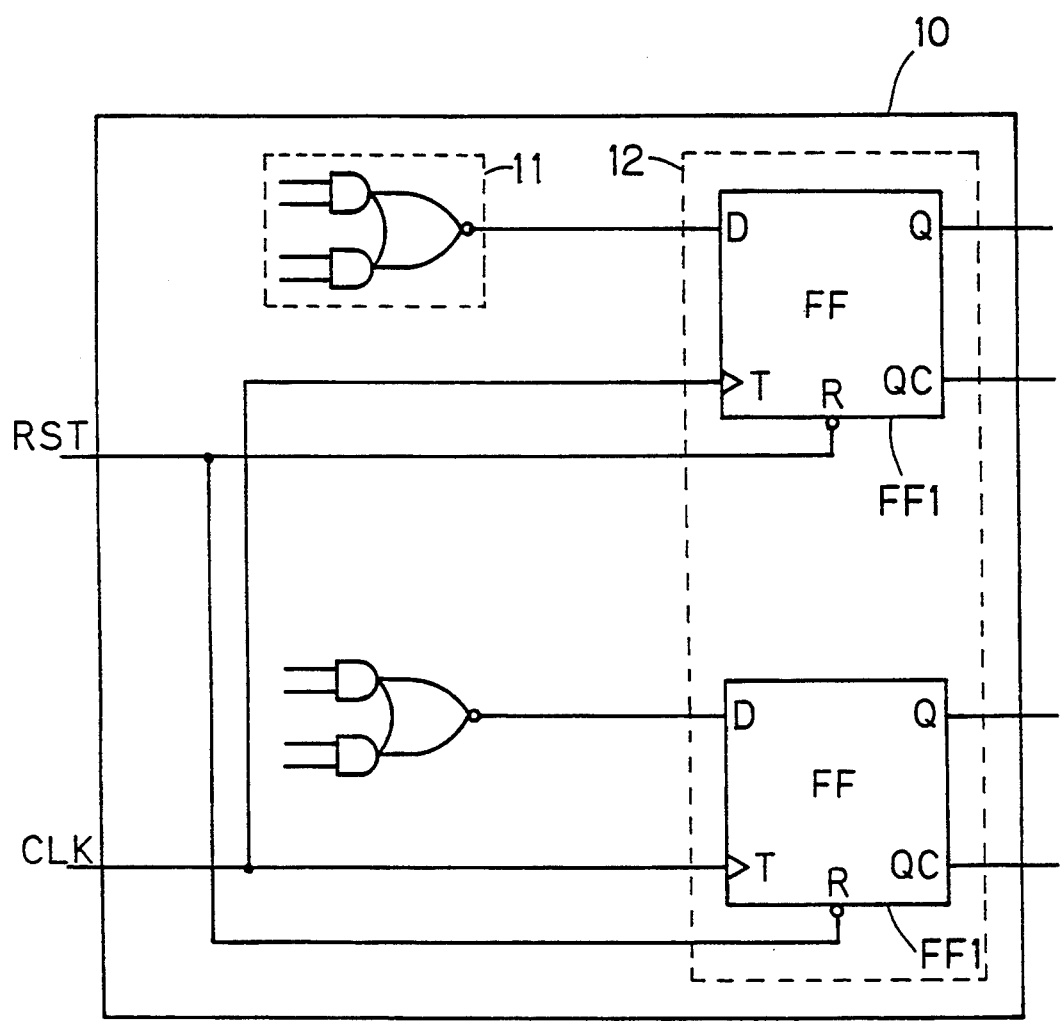
FIGS. 8 and 9 are explanatory diagrams for explaining operations of a logic circuit synthesizing part of the first preferred embodiment of the present invention.

FIG. 8 is a circuitry diagram depicting a logic circuit under synthesizing process. As understood from FIG. 8, n composite gates 11 and n 1-bit input/output flip-flops FF1 are enveloped in a logic function frame 10. Hence, the logic circuit synthesizing part 3 determines whether it is possible to convert the n flip-flops FF1 which are contained in the logic function frame 10.

Figure 9:
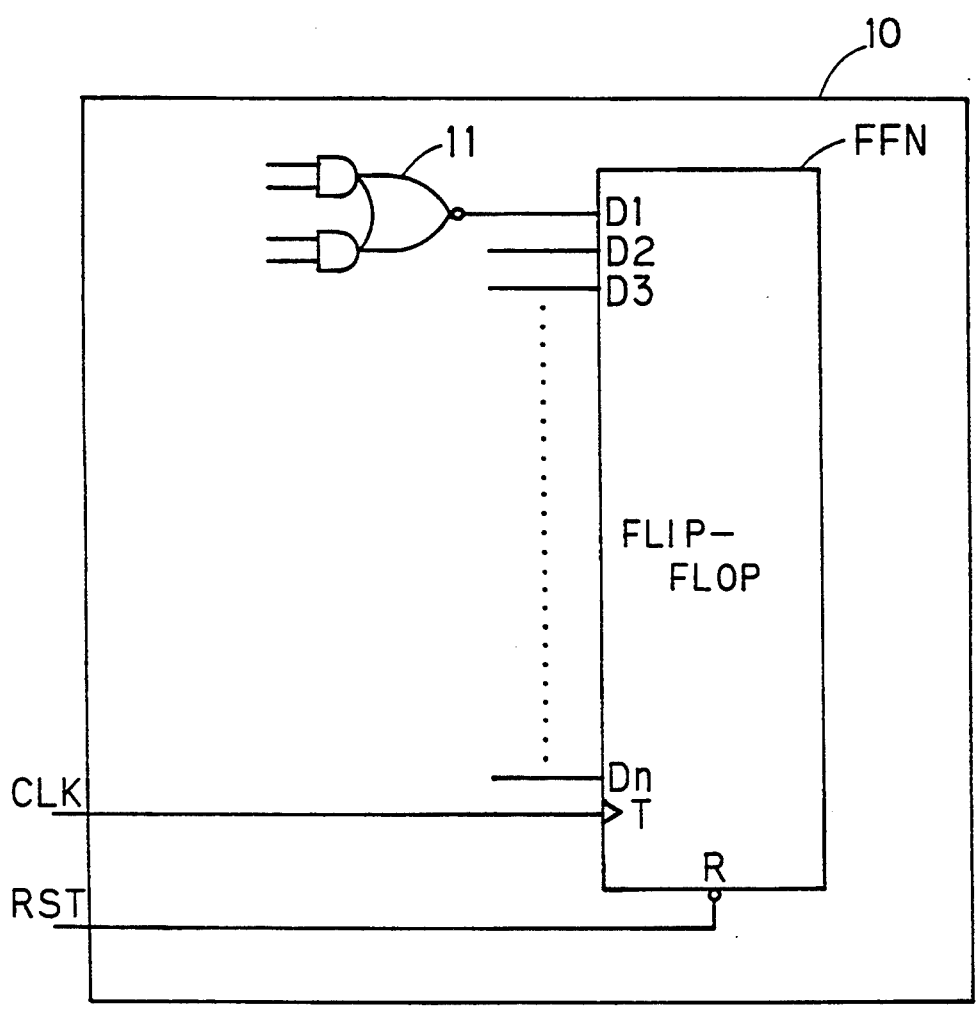

Due to "FFN←FF1*n" registered under the Analogous Function in the conversion library 9 (FIG. 7), the logic circuit synthesizing part 3 converts the n 1-bit input/output flip-flops FF1 into an n-byte input/output flip-flop FFN as shown in FIG. 9. By performing such conversion, existing logic function blocks are minimized in terms of space, wire lengths and the number of signal lines without changing logics, and consequently, synthesized into renewed logic function blocks of better dimensional accuracy.

Thus, the logic circuit synthesizing part 3 converts logic function blocks in sequence, on the basis of what are contained in the conversion library 9 and with recognition about what logic function frames an original logic circuit used to have before the leveling, thereby establishing higher hierarchy logic function blocks. Hence, a quality logic circuit is obtainable.

Figure 17:
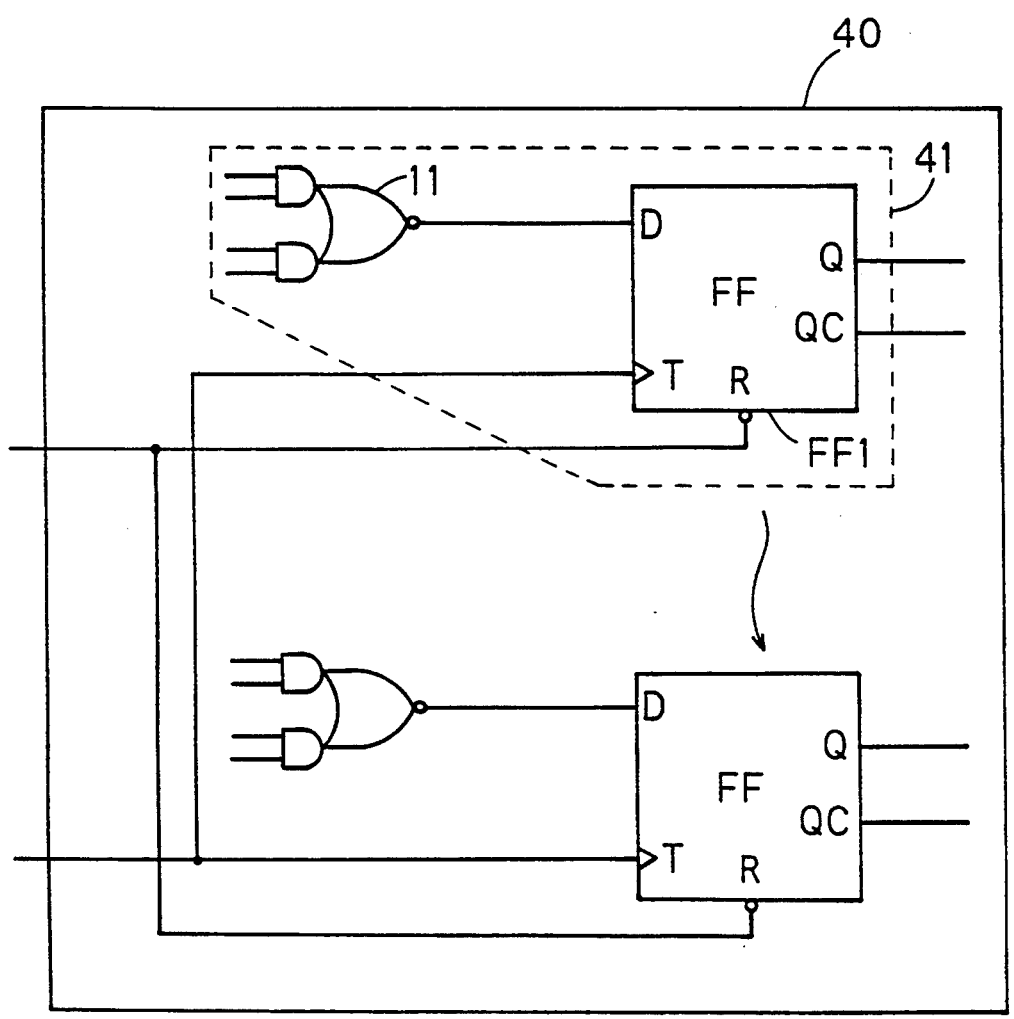
FIGS. 17 and 18 are explanatory diagrams for explaining operations of the logic circuit leveling part of the first and the second preferred embodiments of the present invention.
Figure 18:
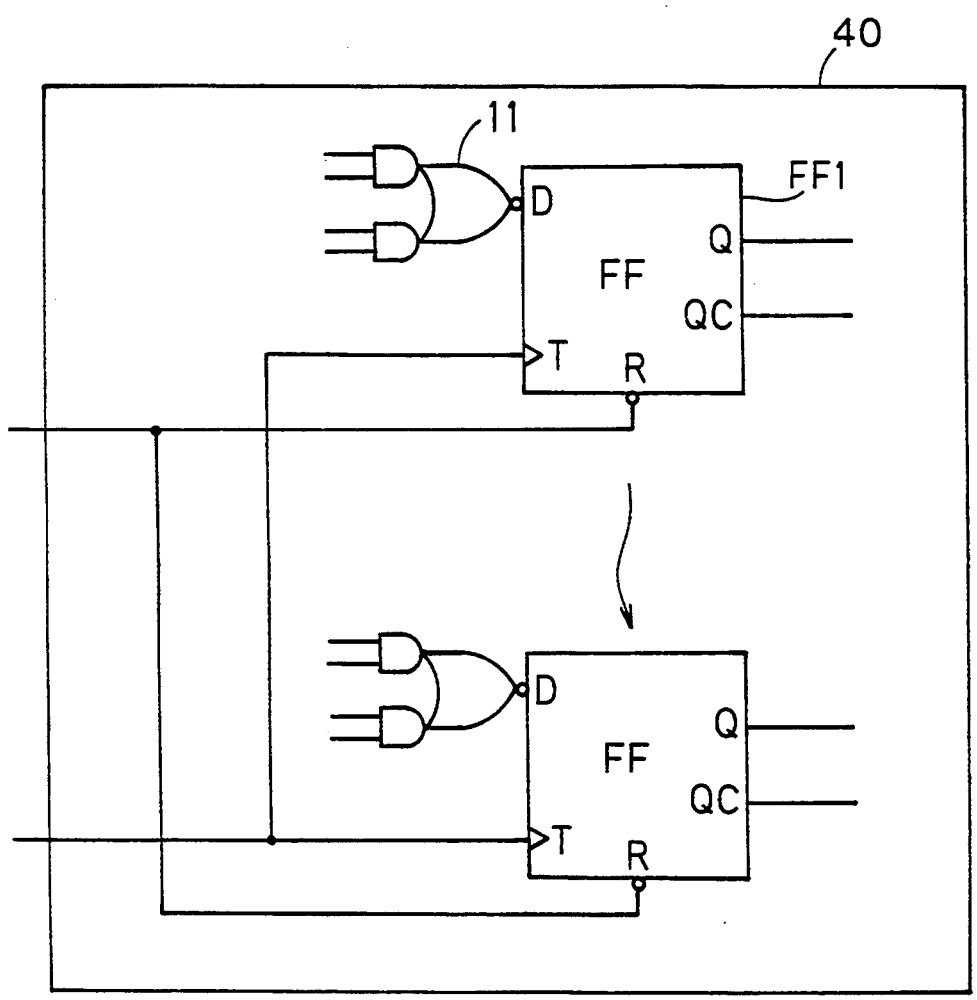

The first preferred embodiment has been described in relation to where the n flip-flops FF1 are converted into the flip-flop FFN. Meanwhile, if a composite gate 11 and a flip-flop FF1 are leveled while recognizing the two elements as a logic function frame 41 as shown in FIG. 17, it is possible to synthesize the two elements into one logic function block. Hence, even in a worst case that it is found from the conversion library 9 that suitable conversion of the two elements does not exist, the composite gate 11 and the flip-flop FF1 are synthesized as shown in FIG. 18.

Figure 10:
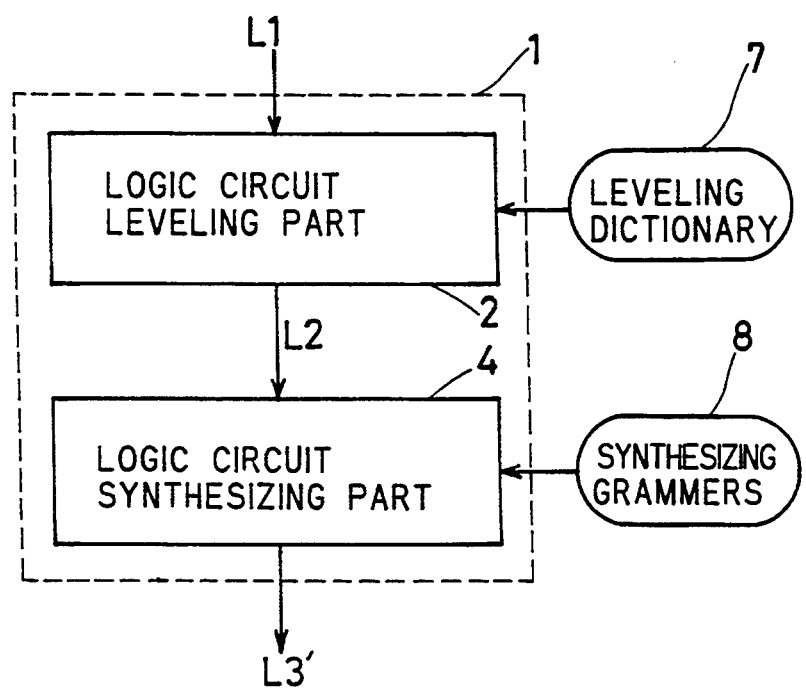
FIG. 10 is a block diagram showing the structure of a logic circuit synthesizer according to the second preferred embodiment of the present invention.

FIG. 10 is a block diagram showing the structure of a logic circuit synthesizer according to a second preferred embodiment of the present invention. As shown in FIG. 10, a logic circuit leveling part 2 receives logic circuit data L1 which define an object logic circuit, levels the logic circuit data L1 in light of a leveling dictionary 7 while maintaining logic function frames, and outputs leveled logic circuit data L2 to a logic circuit synthesizing part 4, which remains similar to the first preferred embodiment.

The logic circuit synthesizing part 4 synthesizes the leveled logic circuit data L2 using synthesize grammars 8 and outputs synthesized logic circuit data L3'.

Figure 11:
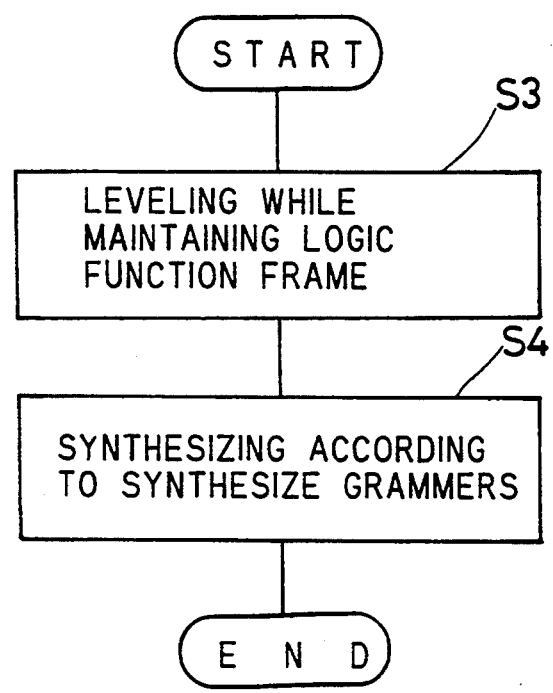
FIG. 11 is a flow chart showing operations of the logic circuit synthesizer of FIG. 10.

FIG. 11 is a flow chart showing operations of the logic circuit synthesizer of the second preferred embodiment. In step S3, the logic circuit leveling part 2 levels the logic circuit data L1 about the object logic circuit on the basis of the leveling dictionary 7 in light of logic function frames. The details of the leveling are similar to those performed in the first preferred embodiment, and therefore, similar description will not be repeated here.

From the step S3, the flow proceeds to step S4 in which the logic circuit synthesizing part 4 synthesizes the leveled logic data L2 while referring to the synthesize grammars 8 and in light of information about the logic function frames which are added to the leveled logic data L2. The logic circuit synthesizing part 4 then outputs the synthesized logic data L3'.

Figure 13:
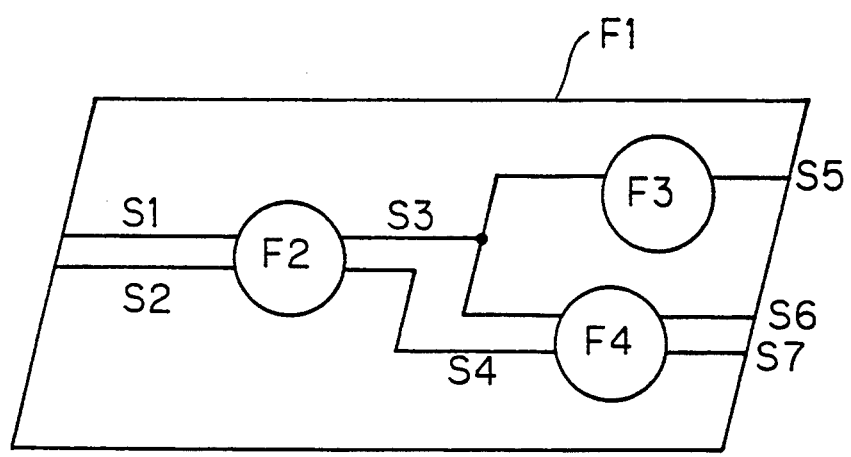
FIG. 13 is an explanatory diagram for explaining operations of a logic circuit leveling part of the second preferred embodiment of the present invention.

FIG. 12 is an explanatory diagram showing an example of the synthesize grammars 8, and FIG. 13 is a diagram showing a logic function block which is obtainable on the basis of the synthesize grammars 8. In FIG. 13, indicated at reference characters F1 to F4 are logic function blocks and indicated at reference characters S1 to S7 are signals. In FIG. 12, the descriptions on the left side of "←" define what are to be outputted from the respective logic function blocks while the descriptions on the right side of "←" define what are to be inputted to the respective logic function blocks. For example, "F4(S6)←F2(S3)+F2(S4)" requires that output signals S3 and S4 from a logic function block F2 are inputted to a logic function block F4.

According to this grammar defined in the synthesize grammars 8, therefore, the logic circuit synthesizing part 4 synthesizes the logic function blocks F2 to F4 into a logic function block F1 which receives signals S1 and S2 and outputs signals S5 to S7.

FIG. 14 is an explanatory diagram showing another example of the synthesize grammars 8. The synthesize grammars 8 of FIG. 14 require that the right side of "←" is synthesized into the left side of "←." Elements A and B to be arranged parallel are defined as (A+B). If an output from an element C is to be received by an element D, the relation is described as C+{D}. Elements E and F with their inputs and outputs connected crisscross are defined as <E+F>.

Figure 15:
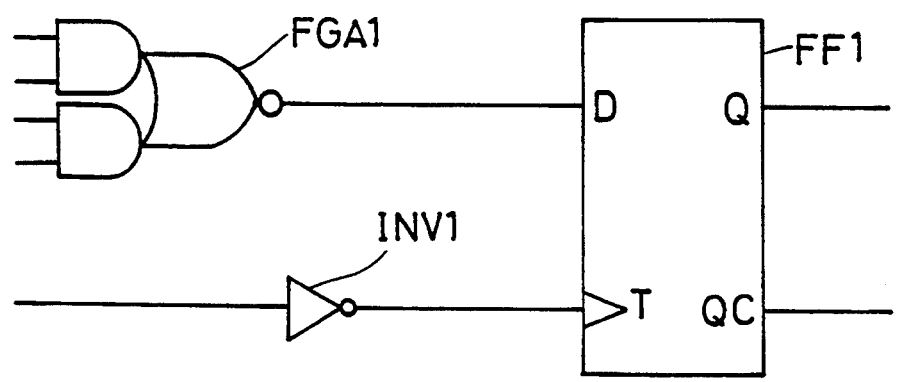
FIGS. 15 and 16 are circuitry diagrams for explaining operations of the logic circuit synthesizing part of the second preferred embodiment of the present invention.
Figure 16:
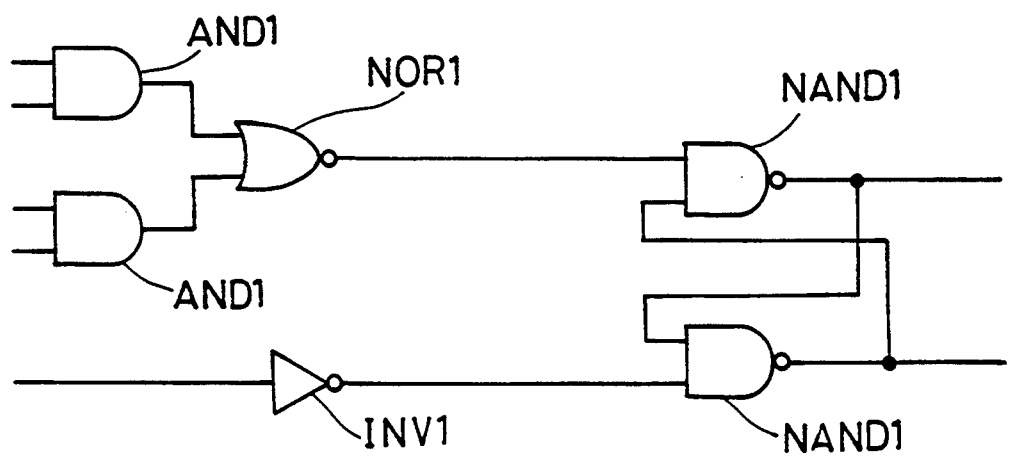

FIGS. 15 and 16 are circuitry diagrams showing how a circuit is synthesized according to the synthesize grammars 8. In FIG. 15, a composite gate is indicated at FGA1, a 1-bit input/output flip-flop is indicated at FF1, and an invertor is indicated at INVI. In FIG. 16, the symbol AND1 represents an AND gate, the symbol NOR1 represents a NOR gate, the symbol NAND1 represents a NAND gate, and the symbol INVI represents an invertor.

Suppose that the logic circuit synthesizing part 4 comes across the circuit of FIG. 16. In this case, required by the grammar "FGA←(AND1+AND1)+-{NOR1}," the logic circuit synthesizing part 4 converts the two AND gates AND1 and the NOR gate NOR1 into a better-dimensioned composite gate FGA. At the same time, according to the grammar "FF1←<-NAND1+NAND1>," the logic circuit synthesizing part 4 also converts the two NAND gates NAND1 into a 1-bit input/output flip-flop FF1 which has better electrical characteristics and a better dimensional accuracy. Hence, the circuit as that shown in FIG. 15 is organized.

Thus, the synthesize grammars 8 contain synthesize logic information according to which non-synthesized logic function blocks (logic primitives) are synthesized into a better dimensioned logic function block featuring better electrical characteristics.

As heretofore described, the logic circuit synthesizing part 4 converts logic function blocks one by one while referring to the synthesize grammars 8 so that higher hierarchy logic function blocks are organized. As a result, a logic function block is produced which is improved in both electrical characteristics and a dimensional accuracy.

In the second preferred embodiment, only if leveled while recognized as enclosed in the same logic function frame, even though not defined as such in the synthesize grammars 8, logic function blocks (such as logic primitives) are synthesized as elements enclosed in the same logic function frame. This is similar to the first preferred embodiment.

In addition, if the synthesize grammars 8 contain detailed grammars, it is possible in the second preferred embodiment that logic function blocks are synthesized without deteriorating their electrical characteristics and dimensional accuracies even though the logic function blocks are not recognized as enclosed in the same logic function frame at all.

While the invention has been described in detail, the foregoing description is in all aspects illustrative and not restrictive. It is understood that numerous other modifications and variations can be devised without departing from the scope of the invention.

We claim:

1. A logic circuit synthesizer, comprising:

logic circuit providing means which provides logic circuit data about an object logic circuit which is comprised of logic primitives and logic function blocks, said logic function blocks each consisting of logic primitives as combined;

logic circuit leveling means which receives and levels said logic circuit data to thereby output leveled logic circuit data, the leveling of said logic circuit data involving expanding and simplifying said logic function blocks of said object logic circuit into smaller logic function blocks or logic primitives while recognizing said logic function blocks of said object logic circuit as logic function frames, said leveled logic circuit data containing information about said logic function frames;

a conversion library for registering post-conversion logic primitives and logic function blocks which are identical in logic function but superior in electrical characteristics or dimensional accuracies to ante-conversion logic primitives or logic function blocks, said post-conversion logic primitives and logic function blocks being registered as conversion logic information in correspondence to said ante-conversion logic primitives and logic function blocks; and logic circuit synthesizing means which receives and synthesizes said leveled logic circuit data to thereby output synthesized logic circuit data, the synthesizing of said leveled logic circuit data involving synthesizing logic primitives or logic function blocks on the basis of said conversion logic information in light of said logic function frames.

2. The logic circuit synthesizer of claim 1, wherein said logic circuit leveling means includes a leveling dictionary prescribing logic primitives and/or logic function blocks to be leveled, said leveling dictionary being referred to during the leveling of said logic circuit data.

3. The logic circuit synthesizer of claim 2, wherein said conversion logic information stored in said conversion library include information in which there are provided post-conversion logic primitives or logic function blocks which are analogous in logic function but superior in electrical characteristics or dimensional characteristics to said ante-conversion logic primitives or logic function blocks in correspondence to said ante-conversion logic primitives and logic function blocks.

4. The logic circuit synthesizer of claim 3, wherein said conversion logic information stored in said conversion library include information in which there are provided post-conversion logic primitives or logic function blocks which are to replace said ante-conversion logic primitives or logic function blocks whose use is forbidden in correspondence thereto.

5. The logic circuit synthesizer of claim 4, wherein said dimensional characteristics include a space required, signal wire lengths and the number of signal wires of logic primitives and/or logic function blocks.

6. The logic circuit synthesizer of claim 5, wherein said electrical characteristics include a drive capability and a delay time of logic primitives and/or logic function blocks.

7. A logic circuit synthesizer, comprising:

leveled logic circuit providing means which provides leveled logic circuit data defining a leveled logic circuit;

a synthesize library for registering post-synthesis logic function blocks which are identical in logic function but superior in electrical characteristics or dimensional accuracies to combination of at least one of ante-synthesis logic primitives and logic function block each consisting of combination of logic primitives, in correspondence thereto, said post-synthesis logic function block being registered as synthesizing logic information; and logic circuit synthesizing means which receives said leveled logic circuit data and synthesizes combination of logic primitives or logic function blocks in said leveled logic circuit into a logic function block in sequence, on the basis of said synthesizing logic information, to thereby output synthesized logic circuit data.

8. The logic circuit synthesizer of claim 7, further comprising:

logic circuit providing means which provides logic circuit data about an object logic circuit which is comprised of logic primitives and logic function blocks, said logic function blocks each consisting of logic primitives as combined; and logic circuit leveling means which receives and levels said logic circuit data to thereby output leveled logic circuit data, the leveling of said logic circuit data involving expanding and simplifying said logic function blocks of said object logic circuit into smaller logic function blocks and/or logic primitives while recognizing said logic function blocks of said object logic circuit as logic function frames, said leveled logic circuit data containing information about said logic function frames.

9. The logic circuit synthesizer of claim 8, wherein said logic circuit synthesizing means is further equipped with a function to output said synthesized logic circuit data in light of said information about said logic function frames.

10. The logic circuit synthesizer of claim 9, said synthesizing logic information include information about said ante-synthesis logic primitives and/or said ante-synthesis logic function blocks which define at least input/output connections of said ante-synthesis logic primitives and/or said ante-synthesis logic function blocks.

* * * * *